(12) United States Patent
Carl, Jr. et al.

(10) Patent No.: US 9,332,679 B2
(45) Date of Patent: May 3, 2016

(54) FAN ASSEMBLY FOR RACK OPTIMIZED SERVER COMPUTERS

(75) Inventors: Ralph J. Carl, Jr., Clifton Park, NY (US); Chellappa Balan, Niskayuna, NY (US); Patrick B. Lawless, Pismo Beach, CA (US); John J. Decker, Cypress, TX (US)

(73) Assignee: Xcelaero Corporation, San Luis Obispo, CA (US)

( * ) Notice: Subject to any disclaimer, the term of this patent is extended or adjusted under 35 U.S.C. 154(b) by 735 days.

(21) Appl. No.: 13/566,246

(22) Filed: Aug. 3, 2012

(65) Prior Publication Data

US 2013/0044430 A1 Feb. 21, 2013

Related U.S. Application Data

(60) Provisional application No. 61/574,593, filed on Aug. 5, 2011.

(51) Int. Cl.
*G06F 1/20* (2006.01)
*H05K 5/00* (2006.01)
*H05K 7/20* (2006.01)

(52) U.S. Cl.
CPC ........ *H05K 7/20772* (2013.01); *H05K 7/20145* (2013.01); *H05K 7/20172* (2013.01); *H05K 7/20554* (2013.01)

(58) Field of Classification Search
CPC .......... H05K 7/20136; H05K 7/20145; H05K 7/20172; H05K 7/20554; H05K 7/20563; H05K 7/20572; H05K 7/20581; H05K 7/20718; H05K 7/20727; H05K 7/20736
USPC .......... 361/679.48–679.5, 694, 695; 312/236; 415/213.1
See application file for complete search history.

(56) References Cited

U.S. PATENT DOCUMENTS

| | | | | |
|---|---|---|---|---|
| 5,412,534 A * | 5/1995 | Cutts et al. | | 361/695 |
| 6,042,474 A * | 3/2000 | Harvey et al. | | 454/184 |
| 6,504,715 B2 * | 1/2003 | Ota et al. | | 361/695 |
| 6,808,411 B2 * | 10/2004 | Chen | | F04D 29/601 |
| | | | | 361/695 |
| 7,042,720 B1 * | 5/2006 | Konshak et al. | | 361/679.33 |
| 2001/0028550 A1 * | 10/2001 | Miyake et al. | | 361/695 |
| 2003/0223193 A1 * | 12/2003 | Smith et al. | | 361/687 |
| 2004/0114323 A1 * | 6/2004 | Mok | | 361/687 |
| 2005/0135060 A1 * | 6/2005 | Cote | | G11B 33/127 |
| | | | | 361/695 |
| 2005/0259393 A1 * | 11/2005 | Vinson et al. | | 361/690 |
| 2005/0280986 A1 * | 12/2005 | Coglitore et al. | | 361/687 |
| 2006/0139877 A1 * | 6/2006 | Germagian et al. | | 361/695 |
| 2007/0171613 A1 * | 7/2007 | McMahan et al. | | 361/695 |
| 2008/0151490 A1 * | 6/2008 | Fan | | H05K 7/20727 |
| | | | | 361/679.47 |
| 2012/0069514 A1 * | 3/2012 | Ross | | 361/679.33 |
| 2012/0140406 A1 * | 6/2012 | Kliewer et al. | | 361/679.48 |

* cited by examiner

*Primary Examiner* — Adam B Dravininkas
(74) *Attorney, Agent, or Firm* — Henry C. Query, Jr.

(57) ABSTRACT

A fan assembly for an electrical device which comprises a number of heat generating electrical components mounted in an enclosure that includes a front wall, a rear wall and two generally parallel sidewalls. The fan assembly comprises a plurality of fans which are arranged in a row that extends generally perpendicularly between the sidewalls. Each fan comprises an axis of rotation which is oriented at an angle relative to the sidewalls, and the fan assembly further includes a plurality of inlet plenums which each communicate with an inlet end of a corresponding fan and a plurality of exhaust plenums which each communicate with an outlet end of a corresponding fan. In operation, the fans generate an airflow which is distributed through the enclosure by the inlet and exhaust plenums to thereby cool the electrical components.

55 Claims, 6 Drawing Sheets

FAN ASSEMBLY FOR RACK OPTIMIZED SERVER COMPUTERS

This patent application is based on and claims priority from U.S. Provisional Patent Application No. 61/574,593 filed on Aug. 5, 2011.

BACKGROUND OF THE INVENTION

The present invention relates to a fan assembly for cooling an electronic device comprising a plurality of heat generating electrical components mounted in an enclosure, such as a server computer. In particular, the invention relates to a fan assembly comprising a row of fans which are oriented with their axis of rotation at an angle, such as ninety degrees, to the sidewalls of the enclosure. This will enable the fan assembly to deliver a required airflow through the enclosure with fewer fans. The number of fans can be chosen to achieve operation at peak efficiency without concern for the uniformity of the flow across the enclosure, as would be the case if the fans were mounted parallel to the sidewalls.

Prior art server computers typically include a number of heat generating electrical components mounted in an enclosure. Such computers commonly employ air to cool the components. Thus, prior art server computers usually include a number of internal fans for generating an airflow over the components. The airflow cools the components through the process of convection by absorbing the heat generated by the components and then dissipating the heat outside the enclosure.

Figure 1:
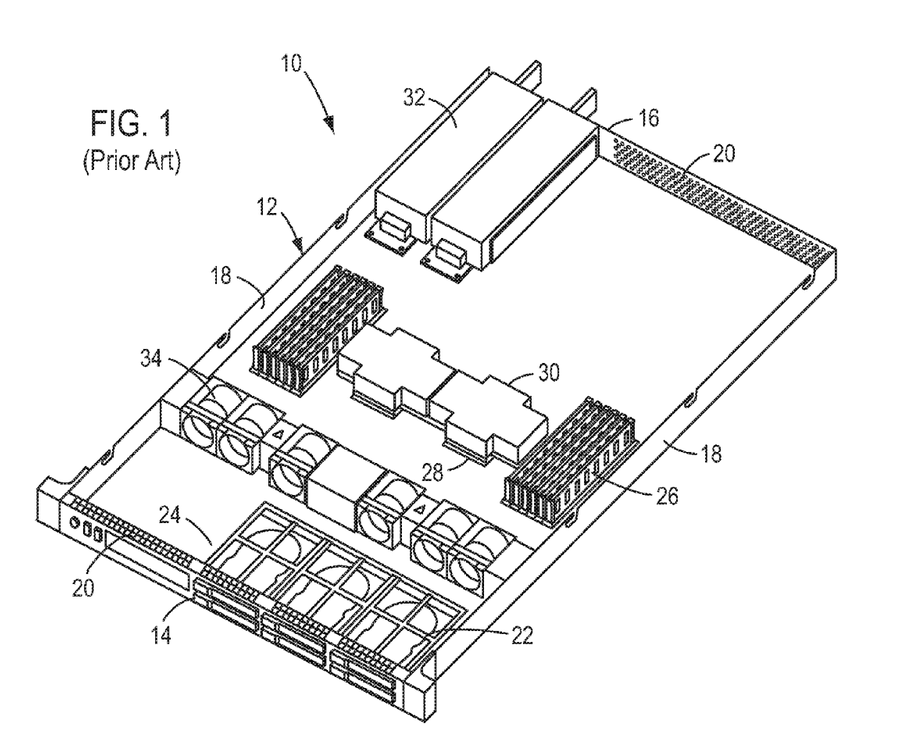
FIG. 1 is a perspective view of a prior art computer server.

An example of a prior art server computer is shown in FIG. 1. This server computer, generally 10, includes a number of electrical components which in this example are housed in a 1 u rack enclosure 12. The rack enclosure 12 comprises a front wall 14, a rear wall 16 and two parallel sidewalls 18. The front and rear walls each comprise a plurality of holes or apertures 20 through which air can pass. Several of the electrical components generate heat during operation of the server computer 10, such as a number of disk drives 22 which are located in a drive bay 24, a plurality of memory modules 26, two processors 28 (each of which is positioned under a corresponding heat sink 30), and one or more power supplies 32. In order to dissipate the heat generated by these components, the server computer 10 also includes a number of fans 34, in this case six, which are oriented with their axes parallel to the sidewalls 18. During operation of the server computer 10, the fans 34 draw air into the enclosure 12 through the apertures in the front wall 14 and force the air over the heat generating components and through the apertures in the rear wall 16. As the air flows over the components, the heat generated by the components is absorbed by the air to thereby cool the components.

In order to reduce the power consumed by the server computer, it is desirable to tailor the airflow distribution over the components so that each component will receive the airflow required to cool the component sufficiently. The current state of the art requires that a number of fans be distributed across the enclosure to provide a uniform airflow over all of the components, as well as to provide redundancy in the event one of the fans should stop operating. With the fans oriented parallel to the side ails as shown in FIG. 1, this often results in the use of a large number of fans operating at less than peak efficiency in order to generate the required airflows over each of the components.

SUMMARY OF THE INVENTION

The present invention addresses these and other limitations in the prior art by providing a fan assembly which requires fewer fans to achieve a desired airflow distribution over the heat generating components of the server computer while also maintaining redundancy. The fan assembly includes a unique fan tray which is mounted in the enclosure and extends between the sidewalls. A number of fans are positioned in the fan tray with their axes of rotation at an angle to the sidewalls, such as ninety degrees. This orientation provides room within the standard envelope for the fan tray to include an exhaust plenum for each fan through which the airflow generated by that fan is directed. In addition, the fan tray includes a number of specially configured guide vanes which are positioned in each exhaust plenum. The exhaust plenum and guide vanes serve to distribute the airflow across a larger portion of the enclosure than would be the case if the fans were oriented with their axes of rotation parallel to the sidewalls as in the prior art. In addition, should one of the fans stop operating, the airflow distribution generated by one or both of the adjacent fans will be sufficient to cool the components. Thus, the fan assembly of the present invention requires fewer fans than the prior art.

Furthermore, installation effects resulting from having impeller leading edge planes in close proximity to those of other parallel impellers and to external obstructions in the enclosure are greatly mitigated, resulting in less power needed to achieve a given airflow. For example, the power required to produce an airflow of 50 cfm through a 1 u enclosure box was reduced from 30 watts for a prior art fan tray to 20 watts for one embodiment of the present invention. Further, to produce 78 cfm through the same 1 u enclosure, the power was reduced from 80 watts to 50 watts. As a further benefit of the invention, noise produced by the fan tray is reduced. For example in free air the noise produced by three fans operating in parallel is 74.5 dB. For the same three fans configured in a tray as in the present invention, the noise was reduced to 73.5 dB for the same net flow.

These and other objects and advantages of the present invention will be made apparent from the following detailed description with reference to the accompanying drawings. In the drawings, the same reference numbers are used to denote similar components in the various embodiments.

BRIEF DESCRIPTION OF THE DRAWINGS

FIG. 9 is a top cross sectional view of yet another embodiment of h fan assembly of the present invention.

DETAILED DESCRIPTION OF THE INVENTION

The present invention provides an integral assembly of a plurality of fans which can be used to dissipate the heat generated by the electrical components of an electronic device, such as a computer. Although the invention has wide application to a variety of electronic devices, it will be described below in the context of a rack mounted server computer.

Figure 2:
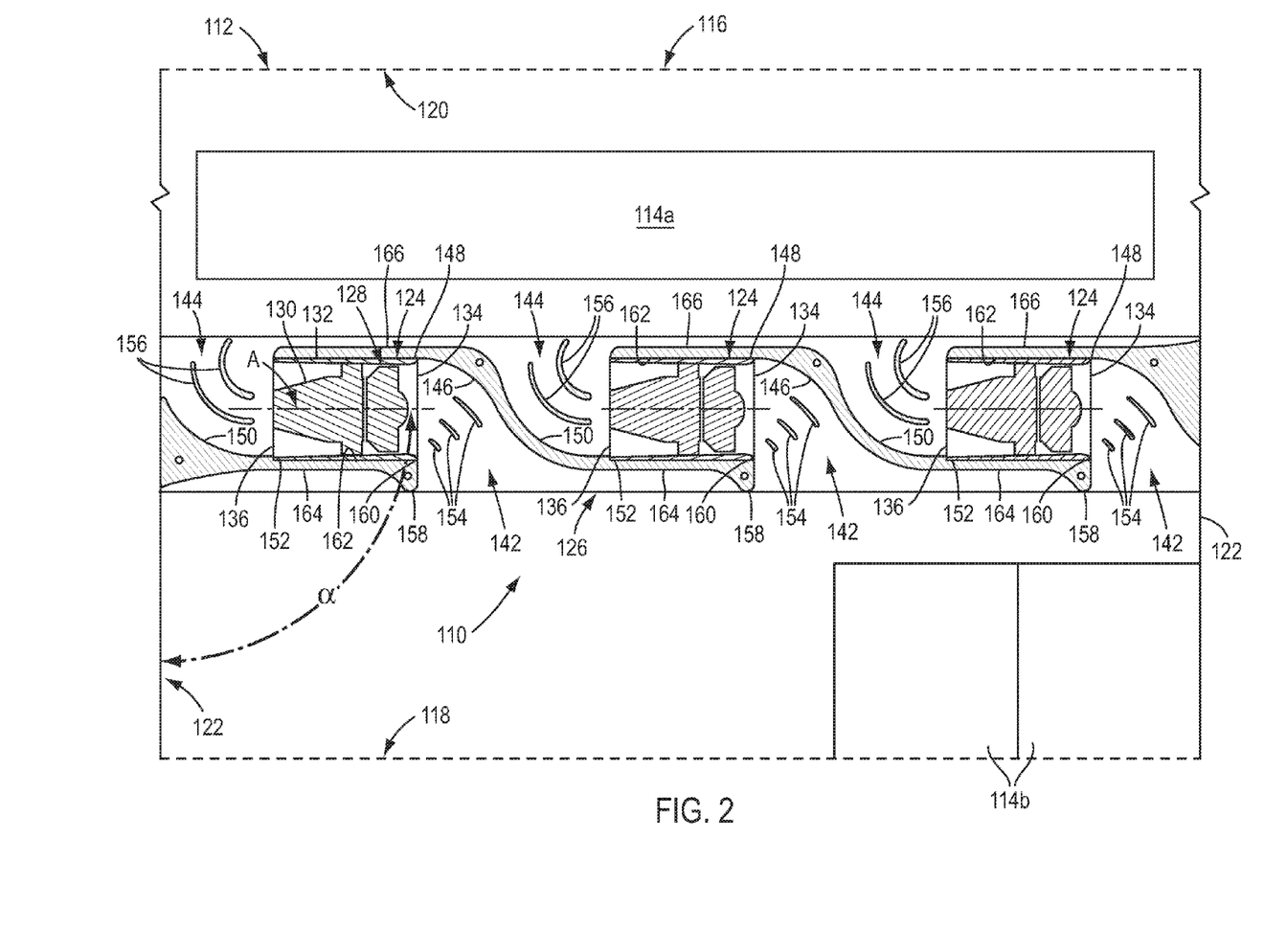
FIG. 2 is a top cross sectional view of one embodiment of the fan assembly of the present invention shown installed in an exemplary server computer, most of the components of which have been removed for clarity.

Referring to FIG. 2, one embodiment of the fan assembly of the present invention, generally 110, is shown installed in a representative server computer 112, such as a 1 u enterprise class rack optimized server. The server computer 112 includes a number of heat generating electrical components, such as memory modules, processors and power supplies (represented generally by the rectangle 114a) located downstream of the fan assembly 110, and a number of disk drives 114b located upstream of the fan assembly. These components are mounted in an enclosure 116 which comprises an air permeable front wall 118, an air permeable rear wall 120 and two parallel, generally solid sidewalls 122. As shown in FIG. 2, the fan assembly 110 extends transversely between the sidewalls 122 and is positioned between the front wall 118 and the electrical components 114. In operation, the fan assembly 110 generate flow of air which enters the enclosure 116 through the front wall 118, flows over the electrical components 114 to thereby convectively cool these components, and then exits the enclosure through the rear wall 120.

Figure 3:
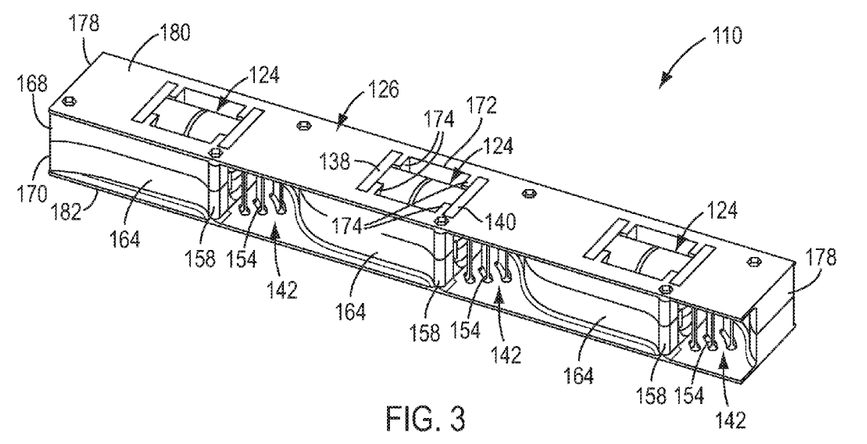
FIG. 3 is a perspective view of the fan assembly shown in FIG. 2.
Figure 4:
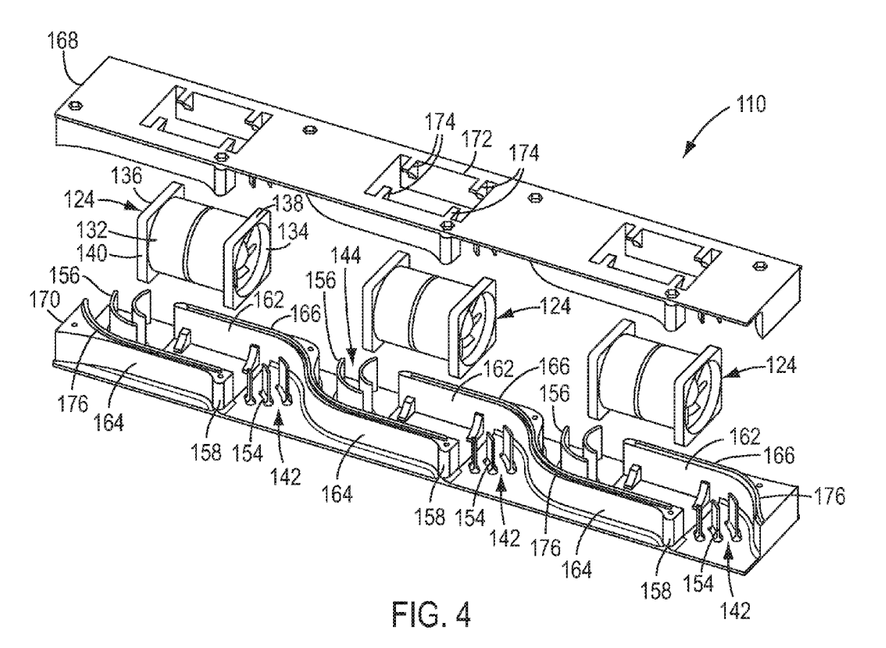
FIG. 4 is an exploded perspective view of the fan assembly shown in FIG. 2.

Referring also to FIGS. 3 and 4, the fan assembly 110 includes a number of fans 124, in this example three, which are mounted in a generally rectangular fan tray 126. The fans 124 are preferably vane-axial fans, such as the Flurry™ 100 Series vane-axial fan manufactured by Xcelaero Corporation of San Luis Obispo, Calif. In this example, each fan 124 includes an impeller 128 which is driven by a motor 130 that is supported in a cylindrical fan housing 132 defining an inlet end 134 of the fan and an outlet end 136 of the fan. Although not required, the fan housing 132 may also be provided with a generally square inlet end flange 138 which surrounds the inlet end 134 and a generally square outlet end flange 140 which surrounds the outlet end 136.

As shown most clearly in FIG. 2, each fan 124 is oriented such that its axis of rotation A forms an angle α with the sidewalls 122. The angle α is preferably between about 20° and 90°. More preferably, the angle α is between about 45° and 90°. In the embodiment of the invention shown in FIG. 2, the axis of rotation A of each fan 124 is perpendicular to the sidewalls 122, i.e., the angle α is 90°. In this manner, the depth of the envelope occupied by the fans 124 is significantly smaller than would be the case if the fans were oriented with their axes of rotation A parallel to the sidewalls 122.

In order to maintain the air flow generated by the fans 124 generally parallel to the sidewalls 122 of the enclosure 116, each fan is mounted in the fan tray 126 between an inlet plenum 142 and an exhaust plenum 144. Each inlet plenum 142 is defined by a generally concave front facing inlet wall section 146 which extends frontward from a rear edge 148 of the inlet end 134 of the fan housing 132. Similarly, each exhaust plenum 144 is defined by a generally concave rear facing outlet wall section 150 which extends rearward from a forward edge 152 of the outlet end 136 of the fan housing 132. The function of the inlet plenums 142 is to turn the airflow upstream of the fan assembly 110 into the fans 124, and the function of the outlet plenums 144 is to turn the airflow exiting the fans into a direction generally parallel to the sidewalls 122 of the enclosure 116. In this manner, even with the fans 124 mounted with their axis A at an angle α relative to the sidewalls 122, the fan assembly 110 is still able to achieve a flow distribution which produces a desired degree of cooling for the components 114.

In designing the inlet and outlet plenums 142, 144, the radius $R_E$ of the outlet wall sections 150 is ideally selected so as to obtain a desired pressure recovery in the air flow exiting the fans 124. The radius $R_I$ of the inlet wall sections 146 may then be determined given the radius $R_E$, the number of fans 124 in the fan assembly 110, and the length of the fan tray 126 (which in most cases corresponds to the width of the enclosure 116). Finally, the radii $R_E$ and $R_I$ may be adjusted empirically to obtain a desired air flow over the components 114. For example, in an embodiment of a fan assembly which comprises three 1.37-inch diameter Flurry™ Series 100 fans mounted in a fan tray 15.87 inches long and oriented with their axes of rotation perpendicular to the sidewalls, $R_I$ may be about 1.4 inches and $R_E$ may be about 1.4 inches.

In the exemplary embodiment of the invention shown in the drawings, each inlet plenum 142 is provided with a number of optional inlet guide vanes 154 and each exhaust plenum 144 is provided with a number of exhaust guide vanes 156. The inlet guide vanes 154, if present, assist the inlet plenum 142 in turning the airflow into the fans 124 and also spread the airflow uniformly across the fan inlet 134. The inlet guide vanes 154 also serve as finger guards for the fans 124. In addition to aiding the exhaust plenum 144 in turning the airflow exiting the fans 124 into a direction generally parallel to the sidewalls 122, the exhaust guide vanes 156 spread the airflow across the components 114. The exhaust guide vanes 156 also serve to inhibit the backflow of air through a corresponding fan 124 which is not operating. The number and configuration of the inlet and exhaust guide vanes 154, 156 may be determined empirically for a given fan assembly 110 and server computer 112.

In addition to the inlet guide vanes 154, the inventors have discovered that the distribution of the airflow forward of the fan assembly 110 and through the inlet plenum 142 may be improved by providing each inlet plenum with a corresponding inlet lip 158. As shown most clearly in FIG. 2, each inlet lip 158 comprises a preferably annular projection which extends frontward from a forward edge 160 of the inlet end 134 of the fan housing 132. The configuration of the inlet lip 158 may be determined empirically for a given fan assembly 110 and server computer 112. An optimal geometry for the lip 158 has the lowest power draw and noise for a desired flow through the enclosure 116.

Referring still to FIGS. 2-4, each fan 124 may be mounted in a respective cavity 162 which is formed in the fan tray 126 between a corresponding pair of generally longitudinal front and rear wall sections 164, 166. In this particular embodiment of the invention, the right end (as viewed in FIG. 2) of each front wall section 164 is connected to or formed integrally with the inlet lip 158 of the adjacent inlet plenum 142. In addition, the left end (as viewed in FIG. 2) of each front wall section 164 is connected to or formed integrally with the outlet wall section 150 of the adjacent exhaust plenum 144, and the right end (as viewed in FIG. 2) of each rear wall section 166 is connected to or formed integrally with the inlet wall section 146 of the adjacent inlet plenum 142. Furthermore, the inlet wall section 146 of the left inlet plenum 142 may be connected to or formed integrally with the outlet wall section 150 of the middle outlet plenum 144, and the inlet wall section of the middle inlet plenum may be connected to or formed integrally with the outlet wall section of the right outlet plenum. In this manner, each cavity 162, together with its adjacent inlet and exhaust plenums 142, 144, defines a continuous flow path through the fan tray 126 in which a corresponding fan 124 is positioned.

Referring to FIG. 4, the fan tray 126 may comprise separate top and bottom panels 168, 170 which when connected together lock the fans 124 in position in their corresponding cavities 162. The top and bottom panels 168, 170 may be made of any suitable material, such as plastic, using any appropriate technique, such as injection molding. For the particular shape of fan 124 depicted in the drawings, at least one of the top and bottom panels 168, 170 may be provided with a rectangular cutout 172 for each fan which comprises the same length as the fan housing 132 and the same width as the end flanges 138, 140. In addition, at least one but preferably both of the top and bottom panels 168, 170 may comprise two longitudinally spaced pairs of struts 174 which are configured to engage the fan housing 132 and preferably also the axial inner portions of the end flanges 138, 140 to thereby firmly hold each fan 124 in position in the fan tray 126. In order to ensure that the fan tray 126 provides an airtight boundary between the low pressure side of the enclosure (i.e., the portion of the enclosure upstream of the fan assembly 110) and the high pressure side of the enclosure (i.e., the portion of the enclosure downstream of the fan assembly), the top panel 168 is ideally sealed to the bottom panel 170 using an appropriate number of suitable gaskets 176 positioned between corresponding halves of the wall sections 146, 150, 164, 166 and preferably also the guide vanes 154, 156.

The fan tray 126 is also ideally sealed to the enclosure 116 in order to effectively separate the low pressure side of the enclosure from the high pressure side of the enclosure. In order to facilitate this sealing, the fan tray 126 may comprise generally planar ends 178, a generally planar top 180 and a generally planar bottom 182 (FIG. 3). In this manner, the sides 178 may be sealed to the sidewalls 122 of the enclosure 116, the top 180 may be sealed to the top cover of the enclosure and the bottom 182 may be sealed to the bottom of the enclosure using, for example, one or more appropriately configured gaskets (not shown).

Figure 5:
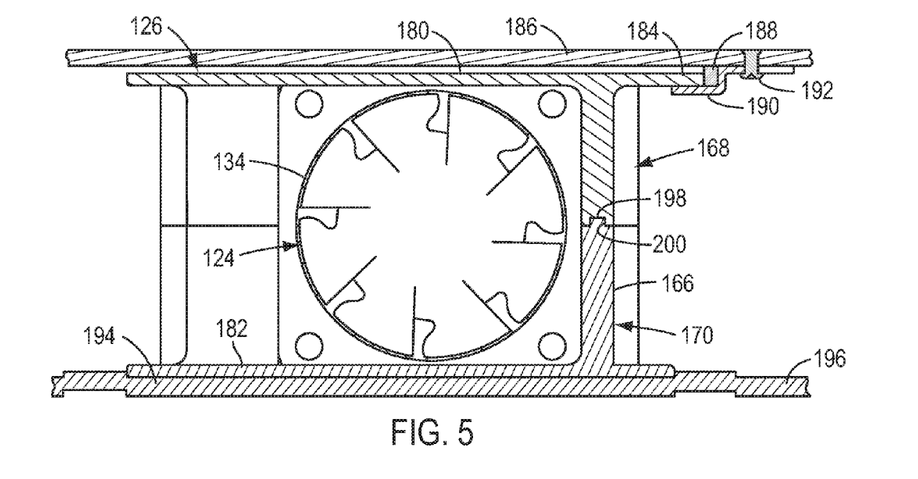
FIG. 5 is a partial side cross sectional view of one embodiment of means for sealing the fan assembly to the enclosure of the server computer.

An alternative arrangement for sealing the fan tray 126 to the enclosure 116 is shown in FIG. 5, which is a side cross sectional view of the fan assembly 110 showing the inlet end 134 of one of the fans 124. In this embodiment, the top 180 of the fan tray 126 includes a downstream-side lip 184 which is sealed to a removable top cover 186 of the enclosure 116 with a straight seal 188. The seal 188 may be positioned in an elongated seal support bracket 190 which is secured to the top cover 186 by appropriate means, such as a number of rivets 192. In addition, the bottom 182 of the fan tray 126 may be received in a corresponding recess 194 which is formed in a bottom 196 of the enclosure 116.

FIG. 5 also illustrates another means for sealing the top panel 168 to the bottom panel 170. In this embodiment, a labyrinth seal is created between these components by forming a projection 198 on the upper edge of the bottom panel 170 which is received in a corresponding groove 200 that is formed on the bottom edge of the upper panel 168, or vice-versa. The projection 198 and groove 200 may be formed on corresponding halves of the wall sections 146, 150, 164, 166 and preferably also the guide vanes 154, 156.

Figure 6:
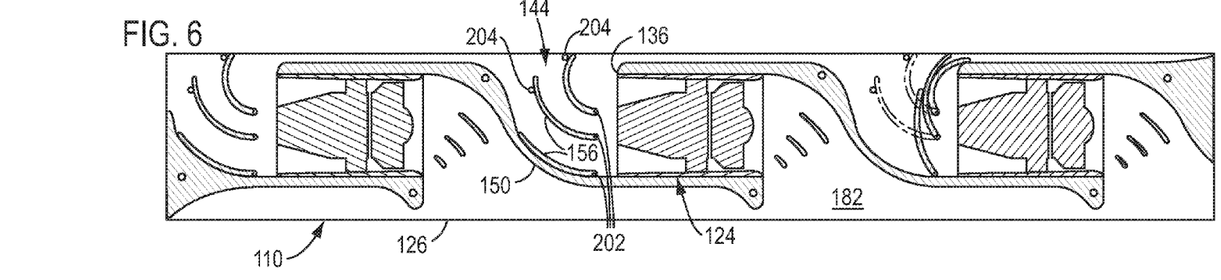
FIG. 6 is a top cross sectional view of another embodiment of the fan assembly of the present invention which comprises one embodiment of a means for preventing the back flow of air through the fan assembly.

With the fan tray 126 separating the high pressure side of the enclosure 116 from the low pressure side, it is desirably to include means for preventing the backflow of air through the fan assembly 110 should one or more of the fans 124 cease operating. Referring to FIG. 6, for example, an embodiment of the fan assembly 110 is shown in which the exhaust guide vanes 156 are configured to function as a one-way valve for their corresponding exhaust plenums 144. In this embodiment, the upstream end of each exhaust guide vane 156 is connected by a corresponding pivot member 202 to the top 178 or bottom 182, or both, of the fan tray 126 to thereby enable the exhaust guide vanes to swing toward and away from the downstream end 136 of a corresponding fan 124. In addition, the fan tray 126 may be provided with a corresponding stop member for each exhaust guide vane 156 to prevent the guide vane from swinging past its appropriate position when the fan 124 is operating. For example, the stop members for the exhaust guide vanes 156 located adjacent the outlet wall sections 150 may simply be the outlet wall sections themselves, while the stop members for each of the remaining exhaust guide vanes may comprise a small protrusion 204 which is formed on the top 178 or the bottom 182, or both, of the fan tray 126. Thus, under normal operation of the fans 124, the air flow will force the exhaust guide vanes 156 into their open position against the stop members. However, when one of the fans 124 stops operating, the initial backflow of air will force its corresponding guide vanes 156 into the closed position, which is shown for the right-most fan in FIG. 6. In this regard, the closing of the guide vanes 156 may be facilitated by a suitable spring member (not shown), such as a torsion sprang which is connected between the pivot 202 and its corresponding guide vane.

Figure 7:
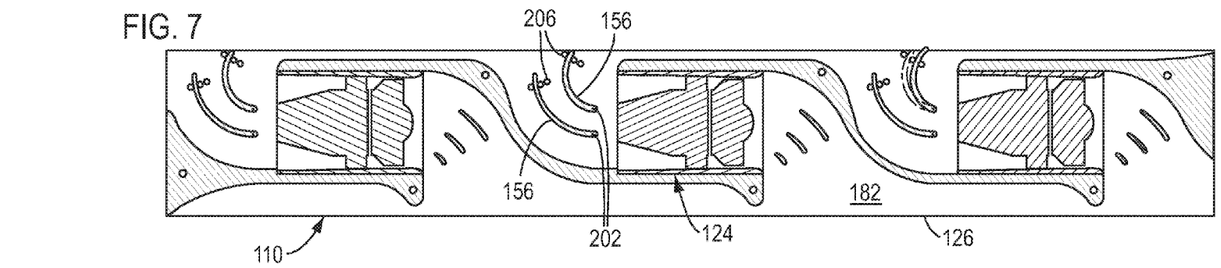
FIG. 7 is a top cross sectional view of a further embodiment of the fan assembly of the present invention which comprises an embodiment of a means for adjusting the orientation of the exhaust guide vane components of the invention.

In another embodiment of the invention which is shown in FIG. 7, the fan assembly 110 is provided with means for enabling the orientation of the exhaust guide vanes 156 to be adjusted. In this embodiment, the upstream end of each exhaust guide vane 156 is connected by a corresponding pivot member 202 to the top 178 or bottom 182, or both, of the fan tray 126. In addition, for each exhaust guide vane 156 the fan tray 126 comprises a series of detents 206 which are formed on the top 178 or the bottom 182, or both, of the fan tray 126. Thus, the orientation of each exhaust guide vane 156 can be adjusted by pivoting the guide vane to a desired position between an adjacent pair of detents 206. In this manner, the orientation of the exhaust guide vanes 156 can be set during installation of the fan assembly 110, which thus allows one set of top and bottom panels 168, 170 to be used in a wide variety of applications.

Figure 8:
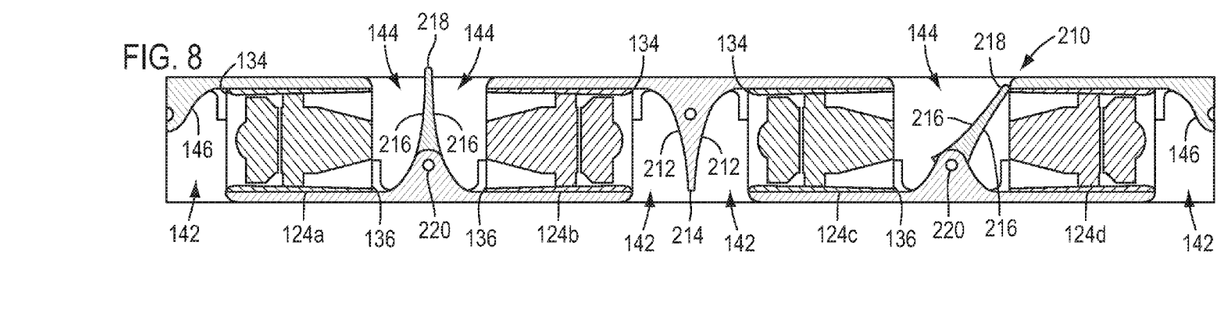
FIG. 8A is a partial top cross sectional view of another embodiment of the fan assembly of the present invention which comprises both the guide vane adjustment means of FIG. 7 and second embodiment of the backflow prevention means, with the backflow prevention means shown in the open position.
FIG. 8B is a view similar to FIG. 8A, but showing the backflow preventing means in the closed position.
Figure 8A:
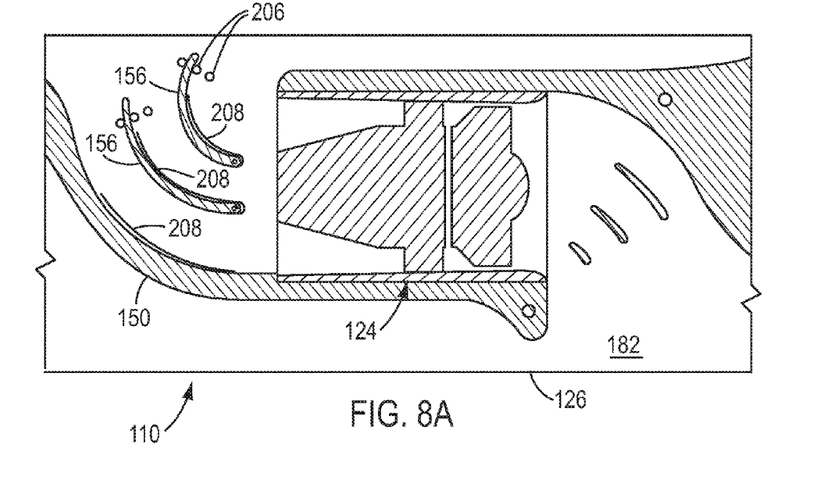
Figure 8B:
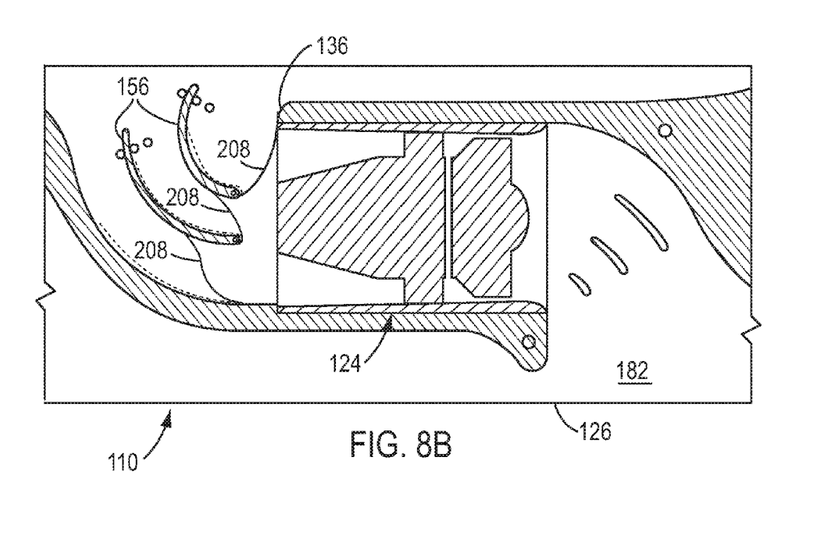

An embodiment of the fan assembly 110 in which the backflow prevention means of the present invention is combined with the guide vane adjustment means just described is illustrated in FIGS. 8A and 8B. In this embodiment, a flexible membrane 208 is attached by suitable means to the upstream end of each exhaust guide vane 156. The membranes may made of a plastic such as acetate and comprise a rectangular configuration having a height which is sufficient to extend completely between the top 179 and bottom 182 of the fan tray 126. In normal operation of each fan 124, the membranes 208 are forced by the airflow into the open position shown in FIG. 8A against their corresponding guide vanes 156. As shown in FIG. 8B, however, when one of the fan 124 stops operating, the backflow of air forces the membranes 208 to fold back against the adjacent guide vanes 156 or the downstream end 136 of the fan to thereby block the backflow.

FIGS. 8A and 8B also illustrate the pivot members 202 and detents 206 which enable each exhaust guide vane to be oriented as desired.

Yet another embodiment of the fan assembly of the present invention is shown in FIG. 9. The fan assembly of this embodiment, generally 210, is similar in many respects to the fan assembly 110 described above. Thus, the fan assembly 210 includes a plurality of fans 124, in this case four, which are mounted in a fan tray 126 that is positioned in the server computer 112 between the sidewalls 122 of the enclosure 116 (not shown). In this embodiment, however, the fans 124 are oriented such that the inlet ends 134 and outlet ends 136 of adjacent fans face each other. For example, the first and second fans 124a, 124b (starting from the left side of the fan assembly 210) are oriented with their outlet ends 136 facing each other, the second and third fans 124b, 124c are oriented with their inlet ends 134 facing each other, and the third and fourth fans 124c, 124d are oriented with their outlet ends facing each other.

Also, although the inlet plenums 142 for the first and fourth fans 24 are each defined by a generally concave front facing inlet wall section 146 as described above, the inlet plenums for the second and third fans are each defined by a respective generally concave front facing inlet wall section 212 which is formed on a corresponding side of an inlet plenum arm 214 that is positioned approximately midway between the fans. In a similar fashion, the exhaust plenums 144 are each defined by a respective generally concave rear facing outlet wall section 216 which is formed on a corresponding side of one of two exhaust plenum arms 218, one of which is positioned approximately midway between the first and second fans 124a, 124b and the other of which is positioned approximately midway between the third and fourth fans 124c, 124d. Also, each outlet plenum arm 218 may be pivotally connected to the fan tray 126 by a transverse pivot bar 220 or other such means in order to allow it to automatically pivot into a blocking position over the outlet end 136 of one of the adjacent fans 124 to thereby prevent the backflow of air through the corresponding exhaust plenum 144 when that fan is not operating.

Figure 10:
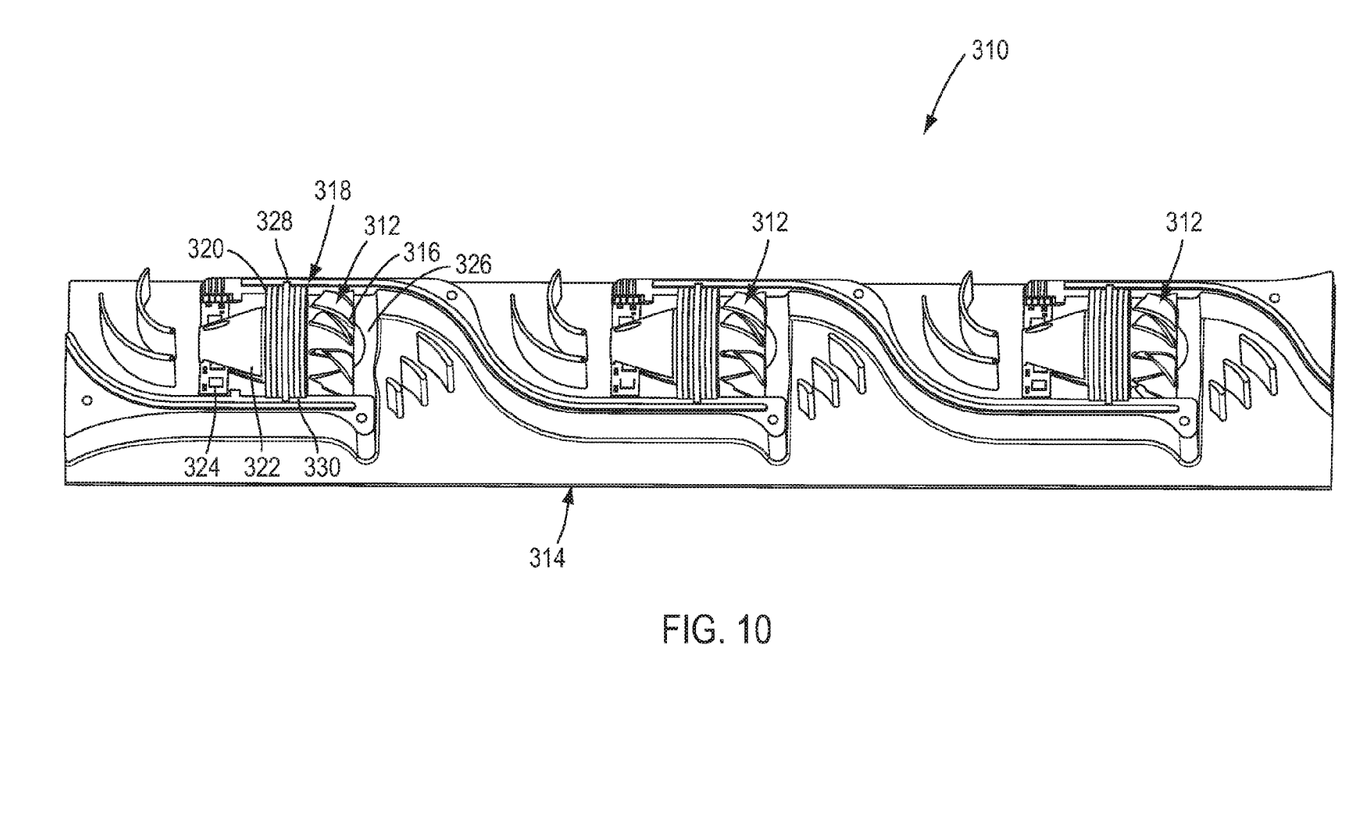
FIG. 10 is a perspective, partial cross sectional view of still another embodiment of the fan assembly of the present invention.

A further embodiment of the invention is shown in FIG. 10. Similar to the previous embodiments, the fan assembly of this embodiment, generally 310, includes a plurality of fans 312 mounted in a single fan tray 314, the top panel of which has been omitted for clarity. In this embodiment, each fan 312 comprises an impeller 316, a motor (not visible) which is positioned axially downstream of the impeller, and an outlet guide vane assembly 318 which surrounds the motor. The outlet guide vane assembly 318 includes a hub (not shown) which is connected to or formed integrally with the motor, an outer ring member 320 which is positioned coaxially with the hub, and a plurality of outlet guide vanes (not shown) which extend radially between the hub and the ring member. Each fan 312 may also include a diffuser tube 322 which is connected to the downstream end of the motor and a number of support struts 324 which extend radially between the diffuser tube and the fan tray 314.

In contrast to the previous embodiments, in the present embodiment the fans 312 do not comprise separate fan housings. Instead, the fans 312 are mounted directly in the fan tray 314. In this manner, the portions of the fan tray 314 adjacent the fans 312 in effect function as housings for the fans which define respective flow paths through the fan tray. As shown in FIG. 10, the outer ring member 320 of the outlet guide vane assembly 318 is mounted in a cavity 326 formed in the fan tray 314 between the front and rear wall sections 164, 166. The outer ring member 320 may include a radial flange 328 which is received in a corresponding groove to help secure the fan 312 in the fan tray 314. A number of elastic elements 330, such as rubber O-rings, may be mounted coaxially around the outer ring member 320 to help isolate the vibrations produced by the fan 312 from the fan tray 314. By incorporating the flow path typically formed by the fan housing directly into the fan tray 314, greater flexibility exists in optimizing the flow path within the footprint available for the fan tray and for isolating the vibrations produced by the motor from the tray.

It should be recognized that, while the present invention has been described in relation to the preferred embodiments thereof, those skilled in the art may develop a wide variation of structural and operational details without departing from the principles of the invention. Therefore, the appended claims are to be construed to cover all equivalents falling within the true scope and spirit of the invention.

What is claimed is:

1. A fan assembly for an electrical device which comprises a number of heat generating electrical components mounted in an enclosure that includes a front wall, a rear wall and two generally parallel sidewalls, the fan assembly comprising:
    a plurality of vane-axial fans which are arranged in a row that extends generally perpendicularly between the sidewalls, each fan comprising an inlet end, an outlet end and an axis of rotation which is oriented at an angle relative to the sidewalls, the inlet and outlet ends being axially aligned with the axis of rotation and the fan being operable to generate an airflow which enters the inlet end and exits the outlet end;
    a plurality of inlet plenums, each of which communicates with the inlet end of a corresponding fan;
    a plurality of exhaust plenums, each of which communicates with the outlet end of a corresponding fan, each exhaust plenum being configured to turn the airflow in a direction which diverges from the axis of rotation of the fan;
    wherein the airflow is distributed by the inlet and exhaust plenums through the enclosure to thereby cool the electrical components; and
    wherein the axis of rotation of each fan is oriented at an angle of between about 20° and 90° relative to the sidewalls.

2. The fan assembly of claim 1, wherein the axis of rotation of each fan is orientated at an angle of between about 45° and 90° relative to the sidewalls.

3. The fan assembly of claim 1, further comprising a generally rectangular fan tray in which the fans are mounted and in which the inlet and exhaust plenums are formed.

4. The fan assembly of claim 3, wherein each inlet plenum is defined by a generally concave let wall section which extends frontward from a rear edge of the inlet end of the fan.

5. The fan assembly of claim 4, wherein each exhaust plenum is defined by a generally concave outlet wall section which extends rearward from a forward edge of the outlet end of the fan.

6. The fan assembly of claim 5, wherein the inlet wall section of at least one fan is formed integrally with the outlet wall section of an adjacent fan.

7. The fan assembly of claim 6, wherein each fan is mounted in the fan tray between a corresponding pair of generally longitudinal front and rear wall sections.

8. The fan assembly of claim 7, wherein the downstream end of the front wall section of each fan is connected to or formed integrally with the outlet wall section of the exhaust plenum for that fan.

9. The fan assembly of claim 8, wherein the upstream end of the rear wall section of each fan is connected to or formed integrally with the inlet wall section of the inlet plenum for that fan.

10. The fan assembly of claim 7, wherein each inlet plenum comprises a corresponding inlet lip which extends frontward from the upstream edge of the front wall section.

11. The fan assembly of claim 3, further comprising a number of inlet guide vanes which are positioned in each inlet plenum.

12. The fan assembly of claim 3, further comprising a number of exhaust guide vanes which are positioned in each exhaust plenum.

13. The fan assembly of claim 12, further comprising means for enabling the orientation of each exhaust guide vane to be adjusted.

14. The fan assembly of claim 13, wherein the adjustment enabling means comprises a pivot member which connects the upstream end of each exhaust guide vane to the fan tray.

15. The fan assembly of claim 14, wherein the adjustment enabling means further comprises a series of detents which are formed on at least one of a top or a bottom of the fan tray.

16. The fan assembly of claim 3, wherein the fan tray comprises separate top and bottom panels.

17. The fan assembly of claim 16, wherein the top panel is sealed to the bottom panel.

18. The fan assembly of claim 3, wherein the fan tray is sealed to the enclosure to thereby define a low pressure side of the enclosure located between the fan tray and the front wall and a high pressure side of the enclosure located between the fan tray and the rear wall.

19. The fan assembly of claim 3, further comprising means for preventing the backflow of air through the fan assembly.

20. The fan assembly of claim 19, wherein the backflow preventing means comprises a number of exhaust guide vanes which are positioned in each exhaust plenum.

21. The fan assembly of claim 20, wherein an upstream end of each exhaust guide vane is pivotally connected to the fan tray to thereby enable the exhaust guide vane to swing toward and away from the downstream end of a corresponding fan.

22. The fan assembly of claim 21, wherein the backflow preventing means further comprises a corresponding stop member for each exhaust guide vane to prevent the guide vane from swinging away from the downstream end of the fan beyond a desired position.

23. The fan assembly of claim 22, wherein each stop member comprises a protrusion which is formed on at least one of a top or a bottom of the fan tray.

24. The fan assembly of claim 20, wherein the backflow preventing means comprises a flexible membrane which is attached to an upstream end of each exhaust guide vane.

25. The fan assembly of claim 3, wherein a first fan and an adjacent second fan are oriented such that their corresponding inlet ends face each other, and wherein a third fan adjacent the second fan is oriented such that its outlet end faces the outlet end of the second fan.

26. The fan assembly of claim 25, herein the inlet plenums for the first and second fans are defined by an inlet plenum arm which is positioned between the first and second fans.

27. The fan assembly of claim 25, wherein the exhaust plenums for the second and third fans are defined by an exhaust plenum arm which is positioned between the second and third fans.

28. The fan assembly of claim 27, wherein the outlet plenum arm is pivotally connected to the fan tray.

29. The fan assembly of claim 3, wherein each fan comprises an impeller which is driven by a motor that is supported in a fan housing, and wherein the fan housing is mounted in the fan tray between the inlet and exhaust plenums.

30. The fan assembly of claim 3, wherein each fan comprises an impeller which is driven by a motor that is supported in an outlet guide van assembly having an outer ring member, and wherein the outer ring member is mounted in the fan tray between the inlet and outlet plenums.

31. The fan assembly of claim 30, further comprising a number of resilient rings which are positioned coaxially between the outer ring member and the fan tray to isolate the fan tray from vibrations generated by the fan.

32. In an electrical device which comprises a number of heat generating electrical components mounted in an enclosure having a front wall, a rear wall and two generally parallel sidewalls, the improvement comprising a fan assembly for generating an airflow through the enclosure which enters through or adjacent the front wall and exits through or adjacent the rear wall, the fan assembly comprising:
 a plurality of vane-axial fans which are arranged in a row that extends generally perpendicularly between the sidewalls, each fan comprising an inlet end, an outlet end and an axis of rotation which is oriented at an angle of between about 20° and 90° relative to the sidewalk, the inlet and outlet ends being axially aligned with the axis of rotation and the fan being operable to generate an airflow which enters the inlet end and exits the outlet end;
 a plurality of inlet plenums, each of which communicates between the inlet end of a corresponding fan and a portion of the enclosure located between the fans and the front wall; and
 a plurality of exhaust plenums, each of which communicates between the outlet end of a corresponding fan and a portion of the enclosure located between the fans and the rear wall, each exhaust plenum being configured to turn the airflow in a direction which diverges from the axis of rotation of the fan;
 wherein the airflow is distributed by the inlet and exhaust plenums through the enclosure to thereby cool the electrical components.

33. The electrical device of claim 32, further comprising a generally rectangular fan tray which extends perpendicularly between the sidewalls, wherein the fan tray comprises the inlet and exhaust plenums and each fan is mounted in the fan tray between a corresponding pair of inlet and exhaust plenums.

34. The electrical device of claim 33, wherein each inlet plenum comprises a generally concave inlet wall section which extends frontward from a rear edge of the inlet end of the fan.

35. The electrical device of claim 33, wherein each exhaust plenum comprises a generally concave outlet wall section which extends rearward from a forward edge of the outlet end of the fan.

36. The electrical device of claim 35, wherein the inlet wall section of at least one fan is connected to or formed integrally with the outlet wall section of an adjacent fan.

37. The electrical device of claim 36, wherein each fan is mounted in the fan tray between a corresponding pair of generally longitudinal front and rear wall sections.

38. The electrical device of claim 37, wherein the downstream end of the front wall section of each fan is connected to or formed integrally with the outlet wall section of the exhaust plenum of that fan.

39. The electrical device of claim 38, wherein the upstream end of the ear wall section of each fan is connected to or formed integrally with the inlet wall section of the inlet plenum of that fan.

40. The electrical device of claim 39, wherein each inlet plenum comprises a corresponding inlet lip which extends frontward from the upstream edge of the front wall section.

41. The electrical device of claim 33, wherein each inlet plenum comprises a number of inlet guide vanes.

42. The electrical device of claim 33, wherein each exhaust plenum comprises a number of exhaust guide vanes.

43. The fan assembly of claim 42, wherein the orientation of at least one exhaust guide vane of at least one exhaust plenum relative to the outlet end of the fan is adjustable.

44. The fan assembly of claim 43, wherein the upstream end of the at least one exhaust guide vane is pivotally connected to the fan tray.

45. The electrical device of claim 33, further comprising means for preventing the backflow of air through the fans.

46. The electrical device of claim 45, wherein the backflow preventing means comprises a number of exhaust guide vanes which are positioned in each exhaust plenum.

47. The fan assembly of claim 46, wherein an upstream end of each exhaust guide vane is pivotally connected to the fan tray to thereby enable the exhaust guide vane to swing toward and away from the downstream end of a corresponding fan.

48. The fan assembly of claim 47, wherein the backflow preventing means further comprises a corresponding stop member for each exhaust guide vane to prevent the guide vane from swinging away from the downstream end of the fan beyond a desired position.

49. The fan assembly of claim 46, wherein the backflow preventing means comprises a flexible membrane which is attached to an upstream end of each exhaust guide vane.

50. The fan assembly of claim 33, wherein a first fan and an adjacent second fan are oriented such that their corresponding inlet ends face each other, and wherein a third fan adjacent the second fare is oriented such that its outlet end faces the outlet end of the second fan.

51. The fan assembly of claim 50, wherein the inlet plenums for the first and second fans are defined by an inlet plenum r which is positioned between the first and second fans.

52. The fan assembly of claim 50, wherein the exhaust plenums for the second and third fans are defined by an exhaust plenum arm which is positioned between the second and third fans.

53. The fan assembly of claim 52, wherein the outlet plenum arm is pivotally connected to the fan tray.

54. The electrical device of claim 33, wherein each fan comprises an impeller which is driven by a motor that is supported in a fan housing, and wherein the fan housing is mounted in the fan tray between the inlet and exhaust plenums.

55. The electrical device of claim 33, wherein each fan comprises an impeller which is driven by a motor that is supported in an outlet guide van assembly, and wherein the outlet guide vane assembly is mounted directly in the fan tray between the inlet and outlet plenums.

* * * * *